United States Patent
Lai et al.

(10) Patent No.: US 6,400,197 B2
(45) Date of Patent: Jun. 4, 2002

(54) DELAY DEVICE HAVING A DELAY LOCK LOOP AND METHOD OF CALIBRATION THEREOF

(75) Inventors: Jiin Lai; Hsin-Chieh Lin; Kuo-Ping Liu, all of Taipei (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/766,952

(22) Filed: Jan. 22, 2001

(30) Foreign Application Priority Data

Jan. 26, 2000 (TW) .................................. 89101270 A

(51) Int. Cl.[7] .............................................. H03L 7/00
(52) U.S. Cl. ........................ 327/161; 327/407; 327/160
(58) Field of Search .......................... 327/99, 141, 144, 327/146–153, 155–163, 407; 331/17; 375/375, 376

(56) References Cited

U.S. PATENT DOCUMENTS

| | | | | |
|---|---|---|---|---|
| 5,889,436 A | * | 3/1999 | Yeung et al. | 331/2 |
| 6,125,157 A | * | 9/2000 | Donnelly et al. | 375/371 |
| 6,137,328 A | * | 10/2000 | Sung | 327/158 |
| 6,140,854 A | * | 10/2000 | Coddington et al. | 327/158 |
| 6,154,073 A | * | 11/2000 | Choi | 327/161 |

* cited by examiner

*Primary Examiner*—My-Trang Nuton
(74) *Attorney, Agent, or Firm*—J.C. Patents

(57) ABSTRACT

A signal delay device having an internal delay lock loop for calibrating the delay interval. The signal delay device receives an input signal and then outputs the signal after a pre-defined delay period. The input signal varies according to a reference clock signal, and the required delay period is a quarter cycle of the clock signal. The delay device includes a multiplexer, an inverter, a phase detector, a counter and a delay element. During calibration, the phase detector, the counter and the delay element form a delay lock loop that can set up the delay time automatically.

16 Claims, 6 Drawing Sheets

DELAY DEVICE HAVING A DELAY LOCK LOOP AND METHOD OF CALIBRATION THEREOF

CROSS-REFERENCE TO RELATED APPLICATION

This application claims the priority benefit of Taiwan application serial no. 89101270, filed Jan. 26, 2000.

BACKGROUND OF THE INVENTION

1. Field of Invention

The present invention relates to a signal delay device and a method of calibrating the delay period. More particularly, the present invention relates to a signal delay device having an internal delay lock loop for calibrating the delay interval.

2. Description of Related Art

Due to the rapid progress in semiconductor technologies, computational capability of a computer increases at a tremendous pace. At present, most computers are constructed using digital circuits. Synchronization among various internal devices is achieved using one or more reference clock signals such that various devices cooperate each other. In earlier computer system, data can be easily transferred among internal devices because the operating speed is low.

FIG. 1 illustrates a conventional timing diagram of data transmission using a clock. In FIG. 1, signal DAT represents transmission data and signal CLK represents the waveform of a system clock. Since the data signal DAT varies according to the clock signal CLK, the receiving terminal of a device is able to receive the data signal correctly. However, this method is only suitable for the transmission of data in earlier operating system. As the operating frequency of a system increases, precision of data transmission is difficult to maintain in the same way so as to lead to many possible system problems.

FIG. 2 illustrates a circuit block diagram of a conventional data transmission system using a clock signal. As shown in FIG. 2, a transmission device 210 transmits data signals DAT to a receiving device 220 through a transmission line 230. During transmission, signal is delayed due to the buffer 214 inside the transmission device 210, the buffer 224 inside the receiving device 220 and the transmission line 230 (flight time). In addition, the flip-flop 212 inside the transmission device 210 and the flip-flop 222 inside the receiving device 220 both use the clock signal CLK to latch-up the data. The clock signal CLK propagating through the transmission line 240 results in clock skew due to the delay in the circuit. In an actual digital system, there can be a total signal delay of 2~3 ns (nano-second) from the transmitting terminal to the receiving terminal. Due to the above consideration, data holding time on data line must be extended for accurate transmission of data through the circuit. Inconsequence, it is difficult to raise clock frequency and data transmission rate.

To reduce clock delay and data loss problem during data transmission, data strobe signals are introduced. FIG. 3A illustrates a circuit block diagram of a conventional data transmission system with data strobe. FIG. 3B illustrates a timing diagram showing data strobe and data line waveform. As shown in FIG. 3A, the flip-flop 316 inside the transmission device 310 converts a clock signal CLK into a data strobe signal DS. Data signal DAT is sent accompanied by the data strobe signals DS. The flip-flop 322 inside the receiving device 320 receives data according to the data strobe signal DS. Hence, delay $T_{buffer}$ for the buffers and flight time on the transmission line $T_{flight}$ are eliminated. Furthermore, both the rising edge and the falling edge of the data strobe signal DS can be used for data transmission. In other words, the system is capable of operation in a double data rate (DDR) mode, for example, in DDR SDRAM (synchronous dynamic random access memory). If skew of the data strobe signal DS between the transmission terminal and the receiving terminal can be disregarded, transmission speed is limited by the setup and hold time of the flip-flop 322 inside the receiving device 320 only. In general, the setup time is about 0.5 ns and hold time is about 0.5 ns.

In real applications, data signal DAT and data strobe signal DS are generated and transmitted from the transmission terminal synchronously. In other words, data signal DAT and data strobe signal DS are transmitted from the transmitting terminal at the rising or falling edge of a clock signal. By having the same delay trace, delay time $T_{buffer}$ of the buffers and delay time $T_{flight}$ of the transmission line are balanced, and skew between the data signal DAT and data strobe signal DS is minimized. Timing sequence of the signal transmission is shown in FIG. 3B. However, since data access is carried out at the rising edge or falling edge of a data strobe signal DS, the data strobe signal DS must be delayed for a period of time at the receiving device 320 to ensure data accuracy.

FIG. 4A illustrates a block diagram showing the addition of a data delay element at the receiving terminal of a conventional data transmission system. FIG. 4B illustrates a timing diagram of data strobe signal, data signal and delayed data strobe signal. As shown in FIGS. 4A and 4B, the rising edge and the falling edge of the data strobe signal DS' that trigger the flip-flop 422 are within the stable portion of the data signal DAT. Hence, the flip-flop 422 is able to latch-up the data precisely.

There are a few types of delay elements. For example, a winding circuit line on a printed circuit board can be used to increase transmission time. Alternatively, passive devices inside an integrated circuit can be used as a delay element. However, both types of delay elements are not so suitable for forming a high efficiency circuit. Winding a long circuit line on a printed circuit board will occupy a large area, and hence will decrease the level of integration. Due to circuit fabrication, the same passive delay elements inside an integrated circuit share different delay time. The maximum delay time in a delay element can be twice the minimum delay time. For example, if the intended delay time of a delay element is 1ns, delay time of the actual delay element may vary from 0.67 ns to 2 ns.

The design of delay element is rather difficult because too much or too little delay for the data strobe signal will lead to the interception of inaccurate data. In fact, accuracy of received data depends on whether the amount of delay ($D_{ds\_da}$) between the data strobe signal DS and the data signal DAT is appropriate. In other words, accuracy depends on whether the rising or falling edge of the data strobe signal DS resides within a stable portion for reading data signal DAT.

Factors that affect the amount of delay $D_{ds\_da}$ between data strobe signal DS and data signal DAT includes: 1. Skew between data strobe signal DS and data signal DAT from the transmission terminal to the receiving terminal (ρs); 2.Delay caused by the delay element (sd). Hence, the amount of total delay $D_{ds\_da}$ between data strobe signal DS and data signal DAT is ρs+sd. Factors that affect signal skew ρs includes: various differences among output buffers, layout on a printed circuit board, threshold voltage of output buffers, setup time and hold time for flip-flops and so on. On the other hand, factors that affect the delay time of a delay element includes: design of the delay element, temperature, humidity, voltage, CPU operating frequency, electromagnetic interference and so on. For example, due to the dynamic influence by various factors, there is a possible delay of between 0.5~1.8 ns for a 66 Mhz system. Furthermore, the amount of delay is different for different operating frequencies such as 66 Mhz, 75 Mhz, 83 Mhz, 100 Mhz, 133 Mhz and higher. In general, as the operating frequency is increased, clock signal cycle is shortened and tolerable error range is reduced. Whenever the data strobe signal DS is too long or too short, the receiving terminal latches inaccurate data such that the system can not operate normally Moreover, even if an accurate delay value is estimated, the delay value may still vary according to changes in other factors such as temperature, voltage, frequency or electromagnetic interference. Hence, ρs and sd may vary and the calculated value may again fall outside the best margin.

To reduce data loss or system failure, the data strobe signal DS is delayed one quarter cycle of the clock signal cycle CLK no matter what the reference clock frequency is. The delayed data strobe signal DS always starts on the mid-portion of the positive half cycle or negative half cycle of the clock signal CLK. Hence, accurate data is always obtained.

FIG. 5 illustrates a circuit block diagram showing a conventional technique for generating a quarter clock cycle delay.

As shown in FIG. 5, the delay elements 511, 512, 513, 514, the phase detector 520, the counter 530 together constitute a delay lock loop. The delay lock loop can substantially equalize the phase of the signal at the two input terminals I1 and I2 of the phase detector 520. All the delay elements 511, 512, 513, 514 and 515 have identical delay characteristics. In other words, when each delay element is set with the same delay parameter through its control terminal C, each delay element will produce the same amount of signal delay.

By properly selecting delay elements 511, 512, 513 and 514, a signal from the input terminal I1 of the phase detector 520 with the delay lock loop being stabilized is delayed by one cycle of the clock CLK. Because all the delay elements 511, 512, 513 and 514 have identical characteristics, delay time of each delay element is one quarter cycle of a clock signal. The delay element 515 is used to delay the data strobe signal DS on a receiving terminal.

Although the aforementioned method of using a delay lock loop to determine the delay parameters of a delay element can produce an accurate delay time, four delay elements are needed in the delay lock loop. Since each delay element has to occupy a certain area, total area occupation of the delay elements on a silicon chip is large. Moreover, in a modem computer system, several clock frequencies are used. Since each clock frequency requires a set of delay lock loop, all the delay elements on a chip occupy a significant area.

In conclusion, conventional delay element system has the following drawbacks:

1. Delay time controlled by increasing the length of conductive lines is not accurate. Furthermore, long conductive lines occupy a large area on a printed circuit board. Winding circuit lines are not good for multiple frequencies.

2. It is also difficult to control the accuracy of delay time by forming a delay circuit with passive devices. In addition, external factors and different operating frequencies can easily influence the delay time of the delay circuit.

3. Although a delay lock loop can generate desired delay within a range of operating frequencies accurately, devices required for a delay lock loop will occupy a large chip area. To produce a delay circuit for multiple operating frequencies, many additional groups of sub-circuits are needed.

SUMMARY OF THE INVENTION

One object of the present invention is to provide a delay device capable of accurately controlling delay time and working in different operating frequencies. In addition, delay is hardly affected by external factors.

A second object of this invention is to provide an inexpensive delay device that occupies a small chip area.

A third object of this invention is to provide a delay device having a delay lock loop capable of calibrating delay time to a precise value.

To achieve these and other advantages and in accordance with the purpose of the invention, as embodied and broadly described herein, the invention provides a delay device having a delay lock loop therein capable of receiving an external input signal and outputting a delayed signal. The delay device comprises a phase detector, a counter and a delay element.

The phase detector has a first input terminal, a second input terminal and an output terminal, wherein the first input terminal receives a complementary signal of a reference signal. The counter has an input terminal and an output terminal, wherein the input terminal is coupled to the output terminal of the phase detector for changing a count value at its output terminal. The delay element has an input terminal, an output terminal and a control terminal. The input terminal receives either the external input signal or the reference signal, the output terminal is coupled to the second input terminal of the phase detector, the output terminal outputs the delayed signal, the control terminal is coupled to the output terminal of the counter, and the counter value determines a pre-defined period between the external input signal and the delayed signal such that the external input signal is delayed by the delay period as the delayed signal output.

In addition, the present invention further provides a method of calibrating a delay parameter. First, a phase detector and a counter are provided, wherein the phase detector has a first input terminal, a second input terminal and an output terminal. A reference signal and a complementary reference signal are then further provided. The reference signal is sent into the delay element to produce a delayed reference signal. The delayed reference signal is transmitted from the delay element to the first input terminal of the phase detector and transmitting the complementary reference signal to the second input terminal of the phase detector. A count value for the counter is then changed according to a output signal on the output terminal of the phase detector; and the delay parameter is obtained according to the counter value while signal phases at the two input terminals of the phase detector become substantially identical. According to one preferred embodiment of this invention, to maintain the delay time of the delay element at a fixed value can be achieved by maintaining the calculated value at the output terminal of the counter.

According to a second preferred embodiment of this invention, the delay time of the delay device is calibrated by changing the state of the selection signal. Hence, the phase detector, the counter, the delay element together form a delay lock loop circuit, such that the phases of the signals at the two input terminals of the phase detector become substantially identical. After the calibration, changing the state of the selection signal is capable of outputting precisely delayed signal for the delay device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
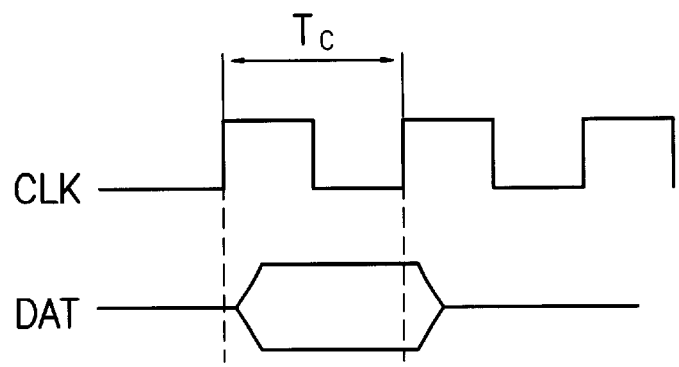
FIG. 1 illustrates a conventional timing diagram of data transmission using a clock signal.
Figure 2:
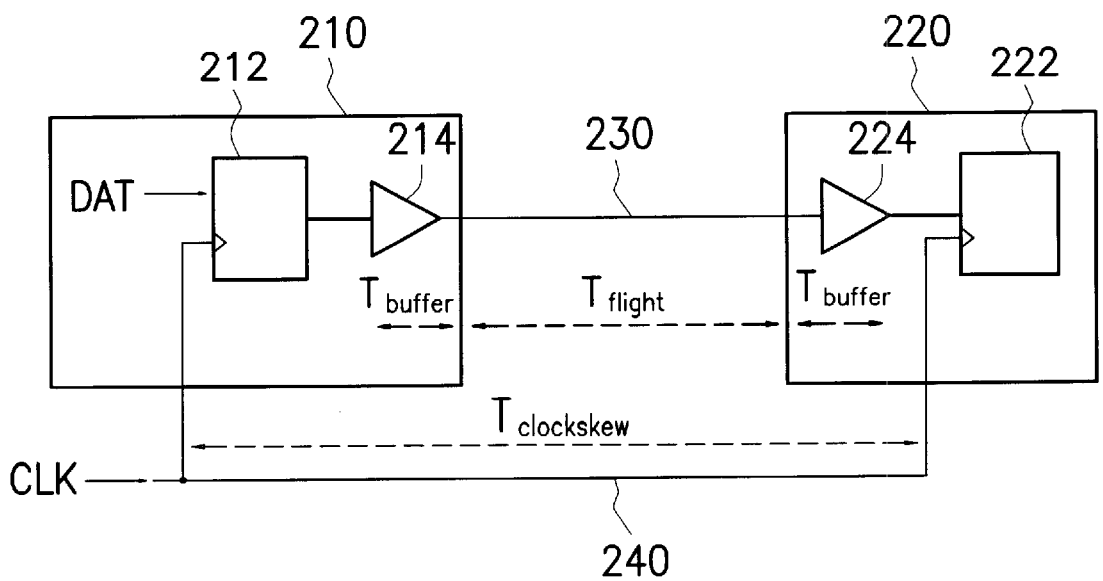
FIG. 2 illustrates a circuit block diagram of a conventional data transmission system using a clock signal.
Figure 3A:
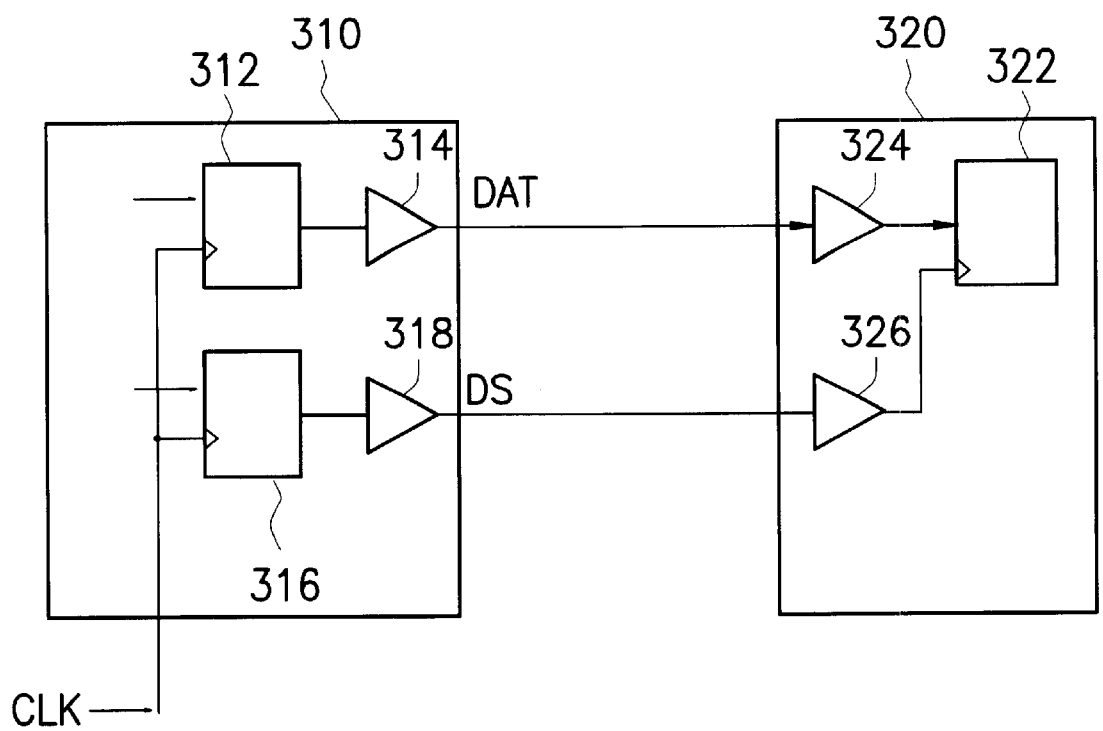
FIG. 3A illustrates a circuit block diagram of a conventional data transmission system with data strobe.
Figure 3B:
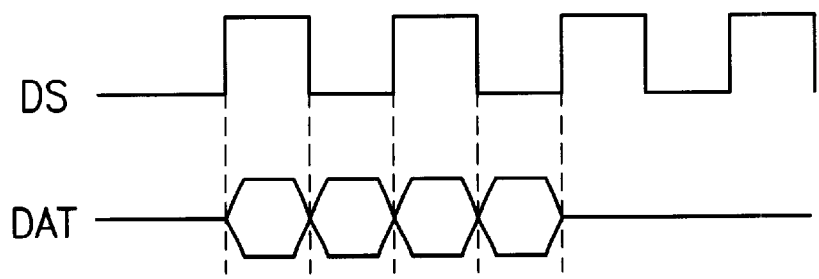
FIG. 3B illustrates a timing diagram showing data strobe and data line waveform.
Figure 4A:
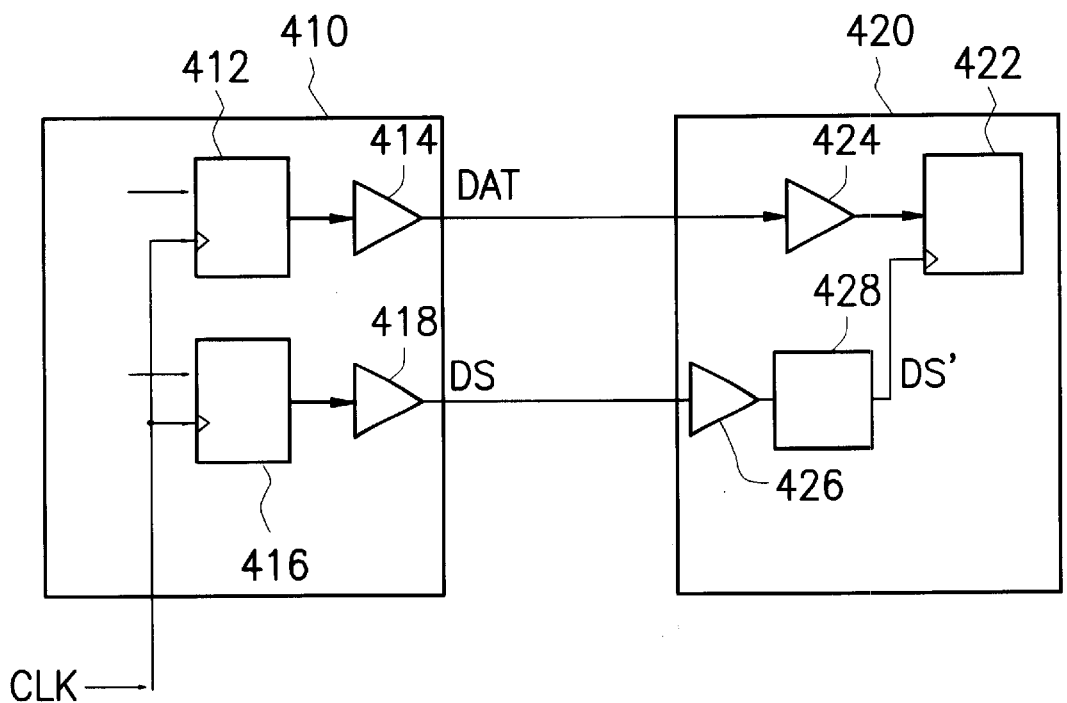
FIG. 4A illustrates a block diagram showing the addition of a data delay element at the receiving terminal of a conventional data transmission system.
Figure 4B:
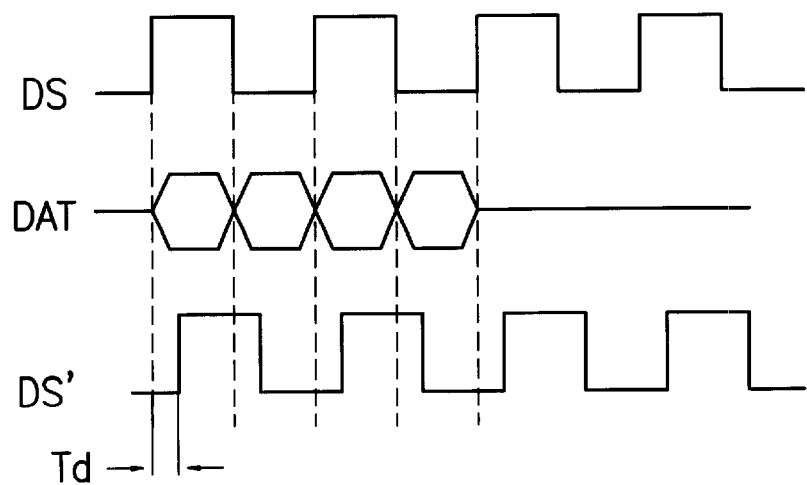
FIG. 4B illustrates a timing diagram of data strobe signal, data signal and delayed data strobe signal.
Figure 5:
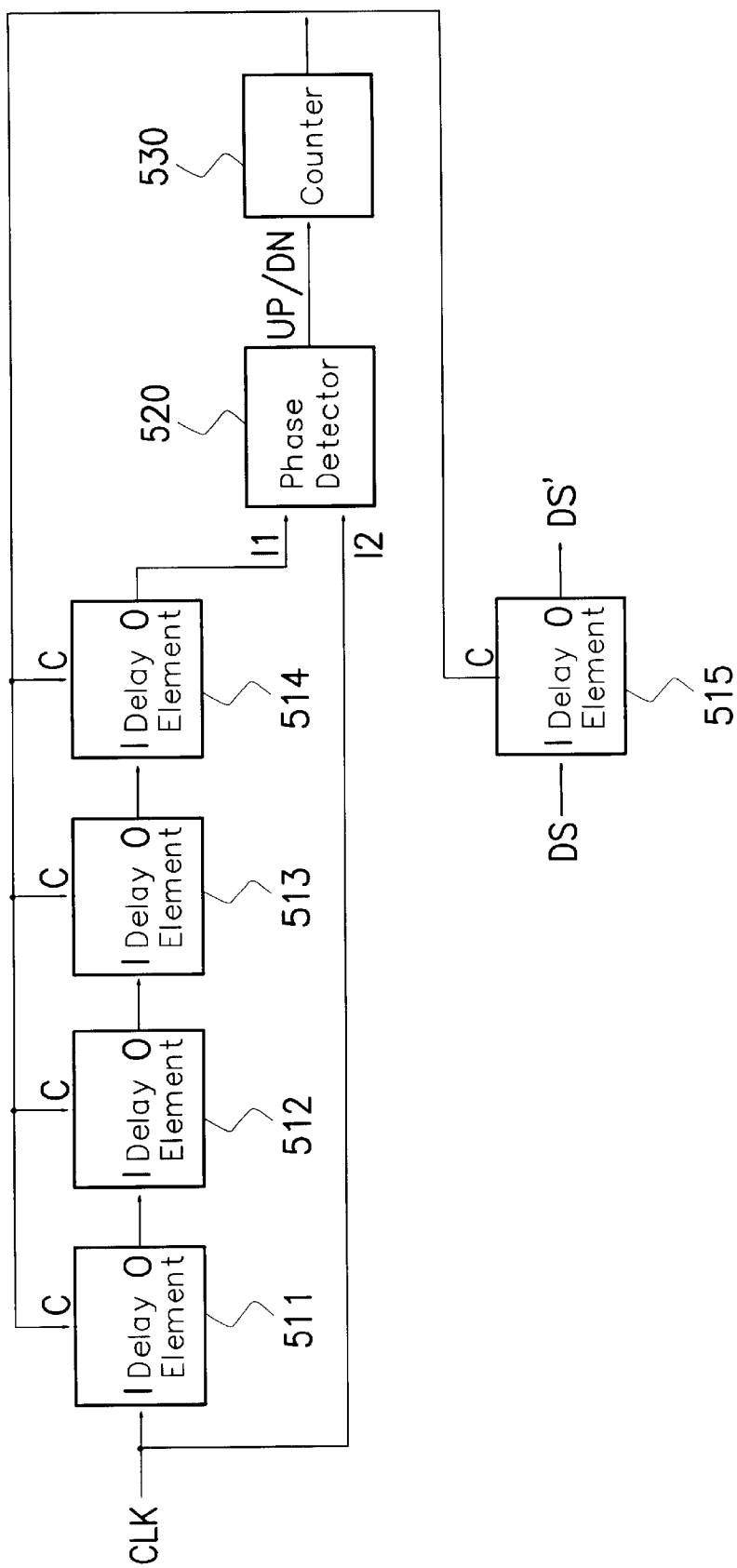
FIG. 5 illustrates a circuit block diagram showing a conventional technique for generating a quarter clock cycle delay.

Reference will now be made in detail to the present preferred embodiments of the invention, examples of which are illustrated in the accompanying drawings. Wherever possible, the same reference numbers are used in the drawings and the description to refer to the same or like parts.

Figure 6A:
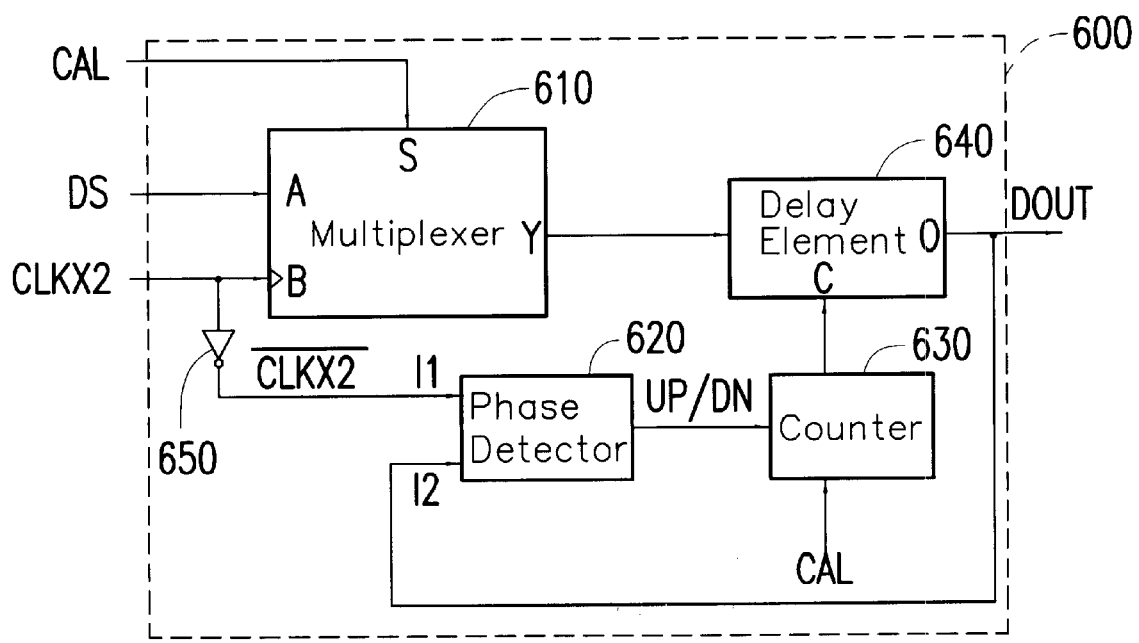
FIG. 6A illustrates a block diagram showing a delay device having a delay lock loop circuit according to a first preferred embodiment of this invention.
Figure 6B:
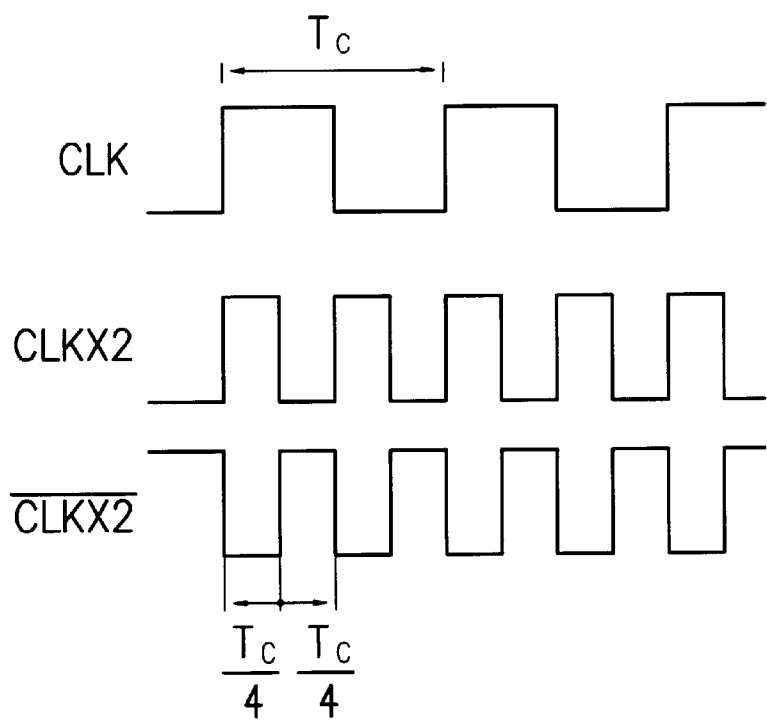
FIG. 6B illustrates a timing diagram of the signals in FIG. 6A.

FIG. 6A illustrates a block diagram showing a delay device having a delay lock loop circuit according to a first preferred embodiment of this invention. FIG. 6B illustrates a timing diagram of the signals in FIG. 6A.

As shown in FIG. 6A, the delay device 600 includes a multiplexer 610, a phase detector 620, a counter 630, a delay element 640 and an inverter 650. Principle function of the delay device 600 is to receive a data strobe signal DS and then output a delayed data strobe signal from DOUT. Total delays are caused by the delay within the multiplexer 610 and the delay within the delay element 640. However, delay is mainly calibrated by changing some parameters of the delay element 640. The phase detector 620, the counter 630 and the delay element 640 together form a delay lock loop.

A signal CLKX2 is used as a reference signal for determining the delay parameters of the delay element 640. The data strobe signal DS is generated according to a clock signal CLK (not shown). In addition, the reference signal CLKX2 has frequency an integral multiple times higher than the clock signal CLK.

In FIG. 6A, the data strobe signal DS and signal CLKX2 are fed into the input terminal A and the input terminal B of the multiplexer 610 respectively. The multiplexer 610 also receives a calibration signal (CAL). By changing the state of the calibration signal CAL, either the data strobe signal DS or the signal CLKX2 is directed to the output terminal Y of the multiplexer 610. The multiplexed signal at the output terminal of the multiplexer 610 is transmitted to the input terminal I of the delay element 640. After a pre-defined period, signal is output from the delay elements 640 via its output terminal O. The delay period is controlled by an input parameter submitted to the control terminal C. The delay element 640 is constructed by connecting a plurality of buffers in series. Hence, by changing the number of serially connected buffers, signal delay time can be modified.

The complementary reference signal $\overline{CLKX2}$ of CLKX2 inverted by the inverter 650 is sent to the input terminal I1 of the phase detector 620. Signal DOUT from the output terminal O of the delay element 640 is returned to the input terminal I2 of the phase detector 620. Signal at the UP/DN terminal of the phase detector 620 is transmitted to the counter 630. The signal coming from the UP/DN terminal of the phase detector 620 will change according to the difference in phase between the signal $\overline{CLKX2}$ and the signal DOUT at the respective input terminals I1 and I2 so as to either increase or decrease the value inside the counter 630. The counter 630 has a terminal for receiving a control signal CAL that can stop the counting.

The value obtained from the counter 630 can serve as a delay parameter. The delay parameter is sent to the control terminal C of the delay element 640 so that delay time of the delay element 640 is determined.

Before the operation of the delay device 600, the device 600 must be calibrated to determine the delay time of the delay element 640. In carrying out the calibration, signaling state of CAL can be changed so that signal CLKX2 is sent to the delay element 640 from the multiplexer 610. In addition, the value inside the counter 630 is changed according to the control of the phase detector 620. Hence, the phase detector 620, the counter 630 and the delay element 640 together form a closed loop capable of equalizing or closing the phase between the signals at the input terminals I1 and I2 of the phase detector 620. In other words, phase of signal $\overline{CLKX2}$ and signal DOUT are substantially identical.

As shown in FIG. 6B, the clock signal CLK is a timing signal for the system. Since the data strobe signal DS is generated according to the clock signal CLK, data strobe DS and clock signal CLK are synchronous to each other. The signal CLKX2 has a frequency that is an integral multiple of the clock signal CLK. In this embodiment, the signal CLKX2 has a cycle time which is only half that of the clock signal CLK. When the clock cycle of the clock signal CLK is Tc, clock cycle of the signal CLKX2 is Tc/2. Furthermore, signal $\overline{CLKX2}$ is the complementary signal of CLKX2.

By properly selecting a delay element 640 inside the delay device 600, signals $\overline{CLKX2}$ and DOUT is stabilized and in the same phase after calibration. DOUT is the signal from the delay element 640 after signal CLKX2 is delayed for a pre-defined period inside the delay element 640. For example, signal CLKX2 is delayed by Tc/4 (for example, for DDR(double date rate) memory), for getting an identical phase with the signal $\overline{CLKX2}$. In other words, the delay time inside the delay element 640 is exactly Tc/4 or one quarter cycle of the clock signal CLK.

After delay parameter calibration, state of the signal CAL is changed so that data strobe signal DS is directed to the delay element 640 via the output terminal Y of the multiplexer 610, and the counter 630 is stopped so that the final value is retained. Hence, the delay device 600 is capable of accurately outputting from DOUT a data strobe signal DS delayed by a quarter cycle of CLK. Obviously, when the delay device 600 is operating in the normal mode, signal CAL is also capable of controlling the phase detector 620 or the delay element 640 such that the phase detector 620 is inactivated or the delay parameter is maintained inside the delay element 640. The phase detector 620, the counter 630 and the delay element 640 no longer form a closed loop and the delay time through the delay element 640 remains unchanged. Hence, a signal delayed by a quarter clock cycle CLK can be sent out the data strobe signal DS transits through the delay device 600.

When the delay device 600 is applied to a personal computer system, delay parameter calibration can be carried out while the computer system boots. Furthermore, if DDR SDRAM is used, the delay parameter calibration can be conducted during the refresh cycle of the SDRAM.

Figure 7:
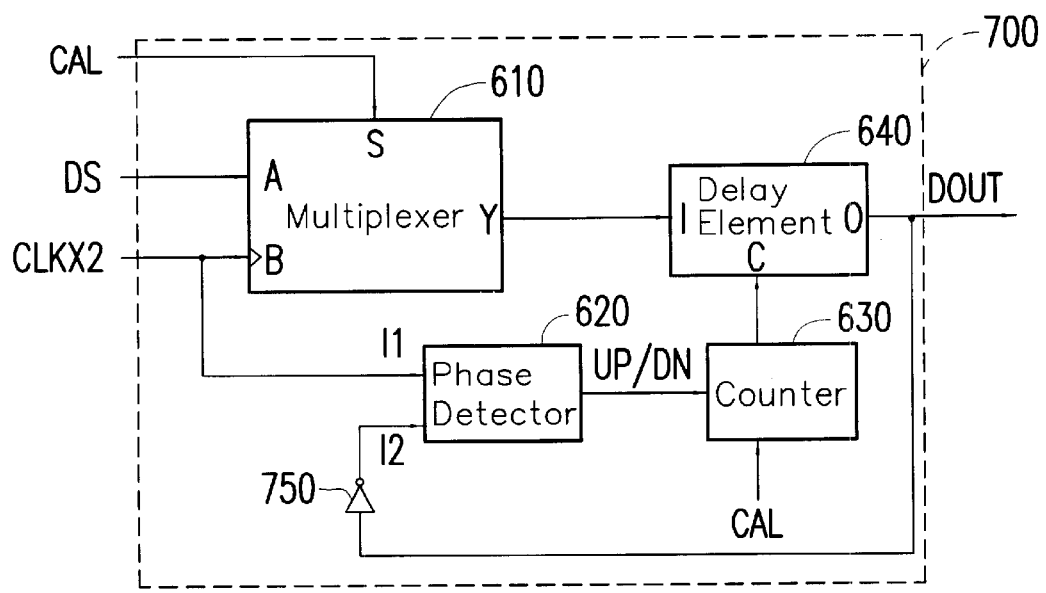
FIG. 7 illustrates a block diagram showing a delay device having a delay lock loop circuit according to a second preferred embodiment of this invention.
Figure 8:
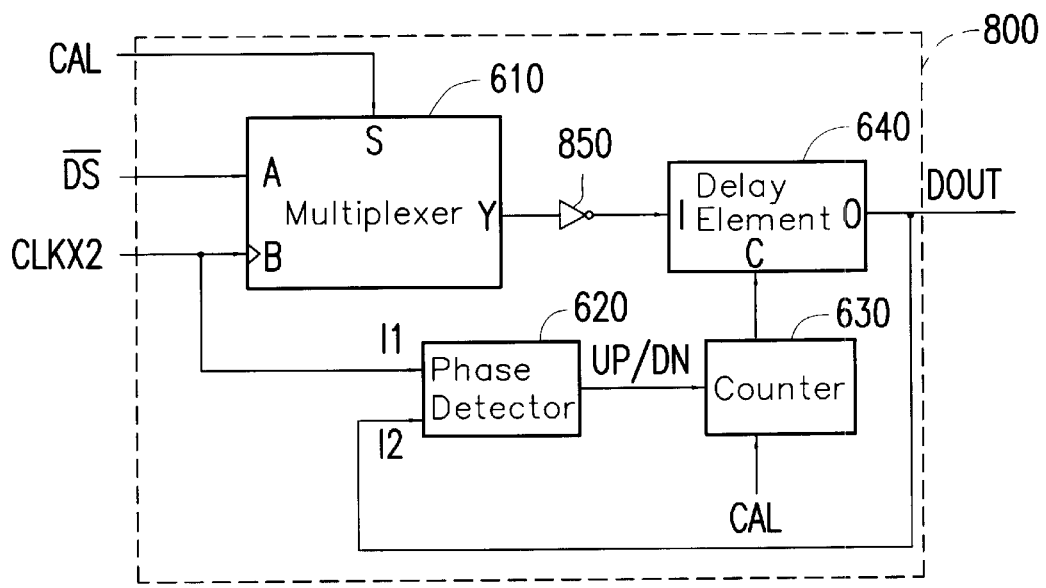
FIG. 8 illustrates a block diagram showing a delay device having a delay lock loop circuit according to a third preferred embodiment of this invention.

FIGS. 7 and 8 illustrate block diagrams showing a delay device having a delay lock loop circuit according to a second and a third preferred embodiment of this invention respectively. The differences among the first, second and third embodiments of this invention lie in the positions of the inverters. Since identical functional and operational principles are used in all these embodiments, detail description is not repeated here. Note that in FIG. 8, the inverter 850 is located between the multiplexer 610 and the delay element 640. Therefore, signal input into the multiplexer 610 must be a complementary signal of the data strobe signal DS in order to produce correct delayed data strobe signal at the output terminal of the delay element 640.

In summary, the advantages of having a delay lock loop control circuit inside a delay device includes:

1. There is no need to lengthen conductive lines. Hence, the conventionally occupied area on a printed circuit board area is reduced. Moreover, delay time can be accurately controlled and the device can be applied under various operating frequencies.

2. Unlike a delay device that uses passive elements, the present invention can accurately control the delay time. In addition, the delay time is rather stable and is hardly affected by external factors.

3. By the addition of a phase detector and a counter, the desired delay parameter can be obtained by calibration. Therefore, the present invention reduces area occupation of the delay device on the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay device having a delay lock loop therein capable of receiving an external input signal and outputting a delayed signal, comprising:

a phase detector having a first input terminal, a second input terminal and an output terminal, wherein the first input terminal receives a complementary signal of a reference signal;

a counter having an input terminal and an output terminal, wherein the input terminal is coupled to the output terminal of the phase detector for changing a count value at its output terminal;

a delay element having an input terminal, an output terminal and a control terminal, wherein the input terminal receives either the external input signal or the reference signal, the output terminal is coupled to the second input terminal of the phase detector, the output terminal outputs the delayed signal, the control terminal is coupled to the output terminal of the counter, and the counter value determines a pre-defined period between the external input signal and the delayed signal such that the external input signal is delayed by the delay period as the delayed signal output; and a multiplexer having a first input terminal, a second input terminal, an output terminal and a control terminal such that the output terminal is coupled to the input terminal of the delay element, the first input terminal is coupled to the external input signal, the second input terminal is coupled to the reference signal.

2. The delay device of claim 1, wherein the control terminal of the multiplexer is coupled to a selection signal so that when a state is selected, either the external input signal at the first input terminal or the reference input signal at the second input terminal is directed to the output terminal.

3. The delay device of claim 2, wherein the device further includes an inverter having an input terminal and an output terminal such that the input terminal is coupled to the reference signal for producing a complementary reference signal at the output terminal of the inverter.

4. The delay device of claim 2, wherein counter value is fixed when the output terminal of the multiplexer transmits the external input signal according to the state selection at the control terminal.

5. A delay device having a delay lock loop therein capable of receiving an external input signal and outputting a delayed signal, comprising:

a phase detector having a first input terminal, a second input terminal and an output terminal, wherein the first input terminal receives a reference signal;

a counter having an input terminal and an output terminal, wherein the input terminal is coupled to the output terminal of the phase detector for changing the count value at its output terminal;

a delay element having an input terminal, an output terminal and a control terminal, wherein the input terminal receives either the external input signal or the reference signal, the output terminal outputs the delayed signal, a complementary signal of the delayed signal is coupled to the second input terminal of the phase detector, the control terminal is coupled to the output terminal of the counter, and the counter value determines a pre-defined period between the external input signal and the delayed signal such that the external input signal is delayed by the delay period as the delayed signal output; and a multiplexer having a first input terminal, a second input terminal, an output terminal and a control terminal such that the output terminal is coupled to the input terminal of the delay element, the first input terminal is coupled to the external input signal, and the second input terminal is coupled to the reference signal.

6. The delay device of claim 5, wherein the control terminal of the multiplexer is coupled to a selection signal so that when a state is selected according to the selection signal, either the external input signal at the first input terminal or the reference input signal at the second input terminal is directed to the output terminal.

7. The delay device of claim 6, wherein counter value is fixed when the output terminal of the multiplexer transmits the external input signal according to the selected state at the control terminal.

8. The delay device of claim 5, wherein the device further includes an inverter having an input terminal and an output terminal such that the input terminal is coupled to the output terminal of the delay element for producing a complementary output signal at the output terminal of the inverter.

9. A delay device having a delay lock loop therein capable of receiving the complementary signal of an external input signal and outputting a delayed signal, comprising:
   a phase detector having a first input terminal, a second input terminal and an output terminal, wherein the first input terminal receives a reference signal;
   a counter having an input terminal and an output terminal, wherein the input terminal is coupled to the output terminal of the phase detector for changing the count value at its output terminal;
   a delay clement having an input terminal, an output terminal and a control terminal, wherein the input terminal receives either the external input signal or the complementary signal of the reference signal, the output terminal outputs the delayed signal, the delayed signal is coupled to the second input terminal of the phase detector, the control terminal is coupled to the output terminal of the counter, and the counter value determines a pre-predefined period between the external input signal and the delayed signal such that the external input signal is delayed by the delay period as the delayed signal output; and
   a multiplexer having a first input terminal, a second input terminal, an output terminal and a control terminal such that the first input terminal is coupled to the complementary signal of the external input signal, and the second input terminal is coupled to the reference signal.

10. The delay device of claim 9, wherein the control terminal of the multiplexer is coupled to a selection signal so that when a state is selected according to the selection signal, either the complementary signal of the external input signal at the first input terminal or the reference input signal at the second input terminal is directed to the output terminal.

11. The delay device of claim 10, wherein counter value is fixed when the output terminal of the multiplexer transmits the complementary signal of the external input signal according to the selected state at the control terminal.

12. The delay device of claim 10, wherein the device further includes an inverter having an input terminal and an output terminal such that the input terminal is coupled to the output terminal of the multiplexer for producing a complementary output signal to the delay element.

13. A delay device having a delay lock loop therein capable of receiving an external input signal with reference to a clock signal and outputting a delayed signal, comprising:
   a multiplexer for receiving the external input signal, a reference signal, a selection signal and outputting a multiplexed signal, wherein the selection signal includes a first and a second state such that the external input signal is directed to the output terminal of the multiplexer when the selection signal is in the first state, and the reference signal is directed to the output terminal of the multiplexer when the selection signal is in the second state, and the reference signal has a frequency which is an integral multiple of the frequency of the clock signal;
   an inverter for receiving the reference signal and outputting a complementary reference signal;
   a phase detector having a first input terminal, a second input terminal and an output terminal, wherein the first input terminal receives the complementary reference signal;
   a counter having an input terminal and an output terminal, wherein the input terminal is coupled to the output terminal of the phase detector for changing the count value at its output terminal; and
   a delay element having an input terminal, an output terminal and a control terminal, wherein the input terminal receives the multiplexed signal, the output terminal is coupled to the second terminal of the phase detector, the output terminal outputs the delayed signal, the control terminal is coupled to the output terminal of the counter, and the counter value determines a pre-defined period between the external input signal and the delayed signal such that the external input signal is delayed by the delay period as the delayed signal output.

14. The delay device of claim 13, wherein the pre-defined period is a quarter of the clock signal cycle.

15. The delay device of claim 13, wherein phase of the signal at the first input terminal and phase of the signal at the second input terminal of the phase detector becomes substantially identical when the selection signal is in a first state, and the pre-defined period of the delay element remains fixed when the selection signal is in a second state.

16. A method of calibrating a delay parameter, comprising the steps of:
   providing a phase detector and a counter, wherein the phase detector has a first input terminal, a second input terminal, and an output terminal;
   providing a multiplexer, wherein either a reference signal or an external signal can be selected;
   selecting and sending the reference signal into a delay element to produce a delayed reference signal;
   transmitting the delayed reference signal from the delay element to the first input terminal of the phase detector and transmitting a complementary reference signal to the second input terminal of the phase detector;
   changing a count value for the counter according to a output signal on the output terminal of the phase detector;
   obtaining the delay parameter according to the counter value when signal phases at the two input terminals of the phase detector become substantially identical; and
   selecting and sending the external signal into the delay element wherein a delay period is controlled by the delay parameter submitted to the delay element.

* * * * *